United States Patent [19]

Suzuki

[11] 4,267,583
[45] May 12, 1981

[54] MEMORY TEST DEVICE WITH WRITE AND PSEUDO WRITE SIGNALS

[75] Inventor: Masao Suzuki, Tokyo, Japan

[73] Assignee: Nippon Electric Co., Ltd., Tokyo, Japan

[21] Appl. No.: 97,625

[22] Filed: Nov. 27, 1979

[30] Foreign Application Priority Data

Nov. 27, 1978 [JP] Japan .................................. 53-146176

[51] Int. Cl.³ .............................................. G11C 29/00
[52] U.S. Cl. .................................. 365/201; 365/190; 365/200
[58] Field of Search ........................ 365/200, 201, 190

[56] References Cited

PUBLICATIONS

Heuber et al., "Storage Cell Disturb Test", IBM Tech. Disc. Bul., vol. 20, No. 8, 1/78, pp. 3175-3176.

Primary Examiner—Stuart N. Hecker
Attorney, Agent, or Firm—Sughrue, Rothwell, Mion, Zinn and Macpeak

[57] ABSTRACT

A memory device having a test function for detecting abnormal memory cells having low hold ability is disclosed. The memory device characteristically comprises a first write control circuit which operates in a normal write mode and a second write control circuit which operates in a pseudo write mode to supply a pseudo write signal lower than a threshold value at which the state or content of the normal memory cell is changed or inverted, to the memory cell to be tested. In such a pseudo write mode, the state of the normal memory cell remains unchanged, but if the tested memory cell is abnormal, its state is changed. After the pseudo write mode, the tested memory cell can be detected to be normal or abnormal by reading out the content of the tested memory cell.

17 Claims, 6 Drawing Figures

MEMORY TEST DEVICE WITH WRITE AND PSEUDO WRITE SIGNALS

This invention relates to a memory device, and especially to a semiconductor memory device fabricated on a semiconductor substrate.

Generally, the operation margin of a semiconductor memory device including a plurality of memory cells is measured by measuring the operation limit of the memory device when the memory device is operated under heavy input conditions beyond the normal one and an excessive power source voltage. With a recent tendency of the large memory capacity of the memory device, a variation in the performances of the memory cells manufactured is unavoidable. For this the operation margin of the memory device is narrowed particularly for the change of ambient or chip temperature. Adversely, the above-described operation margin check at room temperature, for example, 25° C., frequently fails to detect defective cells with poor operation margin. Practically, it is very difficult to find or check such defective memory cells by changing the ambient temperature. Therefore, it is desired to find the defective cells at room temperature.

Accordingly, an object of the invention is to provide a semiconductor memory device with an electric circuit means which enables to detect defective memory cells with temperature-dependance at room temperature.

The invention is based on a discovery that such a defective memory cell already has poor operation margin in the holding state at room temperature and data may readily be written into such a cell by slightly shifting the write voltage from the normal one.

According to one aspect of the invention, there is provided a memory device including a plurality of memory cells, a selection circuit for the memory array, and a write control circuit which operates in a first mode to write data into a selected memory cell and in a second mode to write nothing into at least one of the memory cells when it is normal but write data into the memory cell when it is abnormal.

According to another aspect of the invention, there is provided a semiconductor memory device comprising a memory array including a plurality of memory cells, a selection circuit for the memory array, and a write control circuit which operates in a normal operation mode to write data into a selected memory cell and in a psuedo-write mode on a test mode to write nothing into the memory cell when it is abnormal.

According to still another aspect of the invention, there is provided a semiconduct memory device comprising a memory array including a plurality of memory cells each disposed at an intersection of row and column, a row selection circuit, a column selection circuit and a write control circuit which operates in a normal operation mode to write data into a selected memory cell, and in a test operation mode in which the signals for energizing the row lines within the row selection circuit have substantially the same level and the pseudo-write operation is performed in such a way that, when the memory cells along the column line selected are normal, the data already written into the memory cells of the selected column is not changed, while, when those cells include a defective memory cell or memory cells, the data already written into the memory cell of cells is changed.

Yet in another aspect of the invention, there is provided a semiconductor memory device of which the memory cell includes a flip-flop arrangement having cross-coupled bipolar transistors and a pair of load elements, wherein a voltage across the load element of the transistor now being turned on determines if the memory cell is normal or abnormal.

According to this invention, there is provided a memory device characteristically comprising a first write control circuit which operates in a normal write mode and a second write control circuit which operates in a pseudo write mode to supply a pseudo write signal lower than a threshold value at which the state of the normal memory cell is changed or inverted to the memory cell. In such a pseudo write mode, the state of the memory cell remains unchanged, but if the tested memory cell is abnormal, its state is changed. After the pseudo write mode, it can be checked by reading out the state of the memory cell whether the memory cell is normal or abnormal.

According to this invention, there is also provided a memory device comprising a plurality of memory cells, selection means for selecting one of said memory cells, first write control means which operates in a normal write mode and second write control means which operates in a pseudo write mode to supply a signal lower than a threshold value at which the state of the normal memory cell is inverted, to the memory cell to be tested.

According to this invention, there is also provided a memory device comprising a plurality of memory cells, selection means for selecting one of said memory cells, first write means for supplying a write signal of a normal logic level to selected one of the memory cells, and second write means for supplying pseudo write signal of a logic level lower than the normal logic level to at least the selected one of the memory cells.

Furthermore, according to the invention, there is provided a method for checking a memory device including a plurality of memory cells, comprising the steps of writing the same and one logic data into memory cell to be checked by supplying a write signal having normal logic level, thereto, supplying pseudo data of a logic level smaller than a threshold value at which the content of the normal memory cell is changed, to the memory cell to be checked, thereafter reading out the content of the memory cell to be checked, and detecting whether respective contents of the memory cell written by the writing step has been changed or not, thereby determining abnormal memory cells.

This invention will be better understood from the following description taken in connection with the accompanying drawings, in which:

FIG. 3(b) shows a wave form for illustrating operations at a test mode (pseudo-write) according to the invention;

Figure 1:
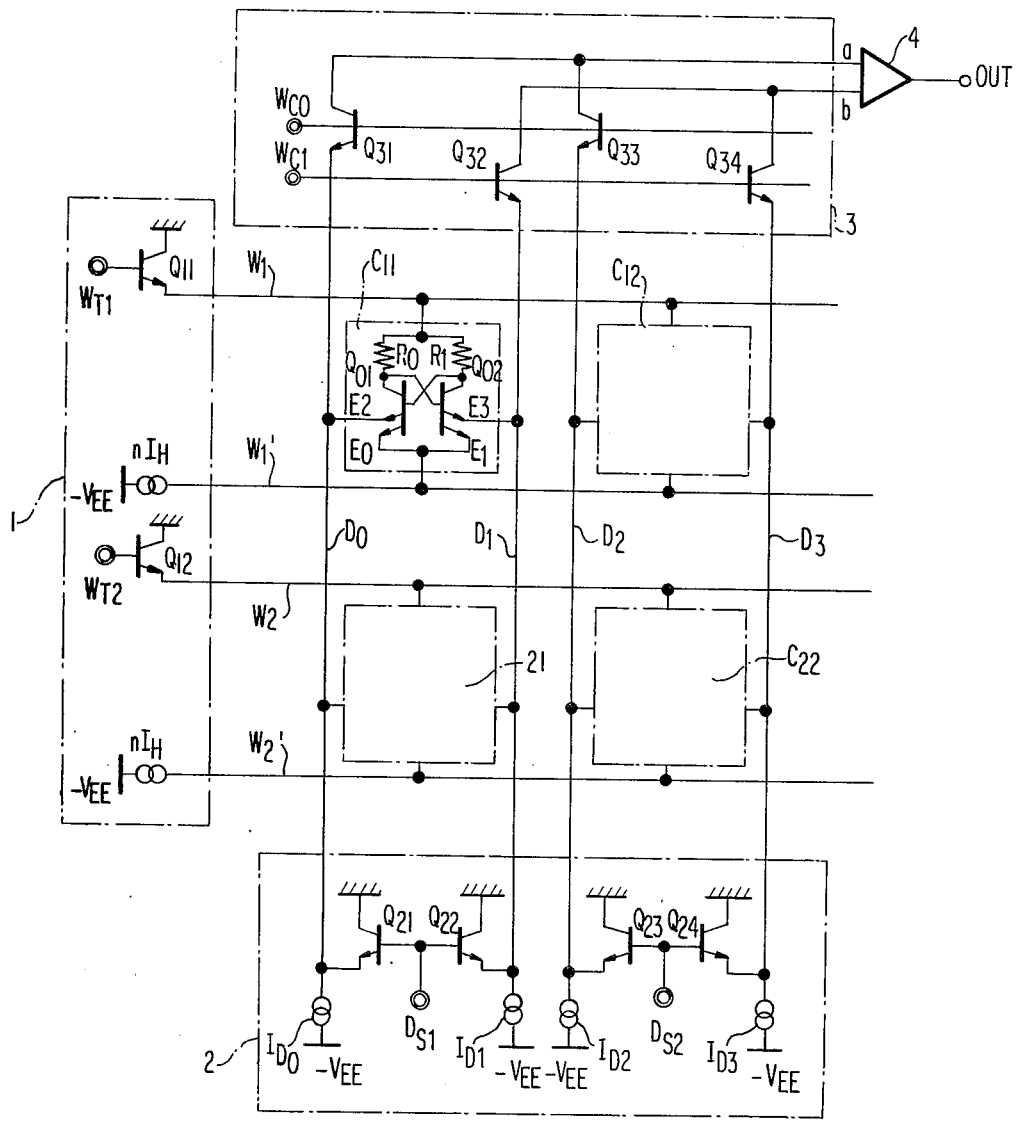
FIG. 1 shows a block diagram of a conventional memory circuit.

A conventional memory device employing bipolar transistors will be described with reference to FIG. 1. A memory array of 2 rows×2 columns will be used for the explanation to be given for simplicity. Of those memory cells $C_{11}$, $C_{12}$, $C_{21}$ and $C_{22}$, the memory cell $C_{11}$ has load resistors $R_0$ and $R_1$ and multi-emitter transistors $Q_{01}$ and $Q_{02}$. Those transistors $Q_{01}$ and $Q_{02}$ are cross-coupled in a manner that the base of one of the transistors is connected to the emitter of the other while the emitter of the former to the base of the latter. In the memory cell $C_{11}$, the emitters $E_2$ and $E_3$ of those transistors are connected to digit lines $D_0$ and $D_1$, and the emitters $E_0$ and $E_1$ are commonly connected to a line $W'_1$ connecting to a current source $IH_1$. The remaining memory cells $C_{12}$, $C_{21}$ and $C_{22}$ have each the same construction as that of the memory cell $C_{11}$ as mentioned above. Accordingly, no explanation of those remaining ones will be referred to.

A row selection circuit 1 has a transistor $Q_{11}$ connecting at the emitter to a row line $W_1$ called as a word line and at the base to a terminal $W_{T1}$, a transistor $Q_{12}$ connecting at the emitter to a row line $W_2$ and at the base to a terminal $W_{T2}$ and a couple of current sources $IH_1$ and $IH_2$. The row selection circuit 1 thus constructed selectively energizes row lines $W_1$ and $W_2$.

A column selection circuit 2 has transistors $Q_{21}$ and $Q_{22}$ which are respectively connected at their emitters to digit lines $D_0$ and $D_1$ and at their bases to a terminal $D_{s1}$ and transistors $Q_{23}$ and $Q_{24}$ which are respectively connected at their emitters to digit lines $D_2$ and $D_3$ and at their base to a terminal $D_{s2}$.

A read/write control circuit 3 has a transistor $Q_{31}$ connecting at the emitter to the digit line $D_0$ which cooperates with the transistor $Q_{01}$ of the memory cell $C_{11}$ also connecting at its emitter to form a current switch circuit for switching current. Similarly, transistors $Q_{32}$, $Q_{33}$ and $Q_{34}$ are connected at their emitters to digit lines $D_1$, $D_2$ and $D_3$, which cooperate with the transistors also connecting at their emitters to the digit lines $D_1$, $D_2$ and $D_3$ to form current switch circuits for switching currents, respectively. The write operation and the read operation into and out of the memory cells are performed through a current switching logic by using control signals $W_{c0}$ and $W_{c1}$. At this time, a power source at high potential is applied to terminals a and b coupled to the inputs of an operational amplifier 4.

In writing "0" into the memory cell $C_{11}$, for example, a high level signal is applied to the row selection terminal $W_{T1}$ and a low level signal is applied to the column selection input terminal $D_{s1}$. At this time, non-selection level signals are applied to the remaining input terminals $W_{T2}$ and $D_{s2}$. In this way, the low and high level signals are respectively applied to the selection lines terminal $D_{s1}$ and the terminal $W_{T1}$ to select the memory cell $C_{11}$. Then, a low level signal is applied to the write terminal $W_{c1}$ and a high or medium level signal is applied to the write terminal $W_{c0}$, thereby to cause current to flow through the emitter $E_3$.

In the read operation, the row and column lines are selected in a similar way to that in the write operation mentioned above. A medium level signal, however, is applied to the input terminals $W_{c1}$ and $W_{c0}$. When a memory cell is not selected, a holding current $I_H$ for a single cell flows through the load resistor $R_0$ or $R_1$ of the conductive transistor. When it is selected, the holding current $I_H$ and a digit current $I_{D0}$ (or $I_{D1}$) flows through the load resistor. Thus the memory cell, when it is not selected, is held by only the hold voltage $V_H = R_0 \times I_H$ (or $R_1 \times I_H$). In order to avoid the erroneous write into the memory cell $C_{21}$ when the write operation is performed into the memory cell $C_{11}$, the low level at the write terminal $W_{c0}$ ($W_{c1}$) must be set to be much higher than the level which is lower than the low level of the row selection terminal $W_{T1}$ ($W_{T2}$) by the holding voltage $V_H$. And it must be substantially equal to the normal low level at the row selection terminal $W_{T1}$ ($W_{T2}$).

The problem is that memory cells with abnormally low holding voltage are included in the memory cells forming the memory array. Such memory cells often operate normally at a room temperature, even through those abnormally operate when it is operated over a whole range of temperature. For this reason, there has never been a method to effectively detect such defective cells at a room temperature.

The inventor has discovered that, in the memory cell which normally operates at a room temperature but erroneously inverts its state at 0° C. This is due to the fact that at least one of the transistors forming such a cell has the base-emitter voltage $V_{BE}$ larger than that of the normal cell by about 20 mV in absolute value. Particularly, the erroneous inversion of the cell state tends to occur when the transistor with the larger voltage $V_{BE}$ conducts. Let us study this in detail by using a case where M (a positive integer) pieces of memory cells are connected to a word line (W) and, in one of those memory cells, one of the transistors has a large base-emitter voltage $V_{BE}$. If all of the M pieces of memory cells operate normally, each cell is held by the current $I_{hold}/M$, which is 1/M of the total current $I_{hold}$ of the current source ($IH_1$). At this time, the holding voltage $V_H$ of each memory cell is approximately $V_H = R \times I_{hold}/M$ (R is resistance of the load resistor of each memory cell). When the voltage $V_{BE}$ of the transistor of one memory cell is large, the holding voltage of the memory cell is reduced by the voltage by which the voltage $V_{BE}$ is larger than the normal one. The holding voltages of the remaining M−1 pieces of cells remain unchanged.

As a result, when the memory cells with the reduced holding voltages are subjected to the read operation at a low temperature, the contents of the memory cell is inverted or, even though it is not selected, data is erronously loaded into it.

Figure 2:
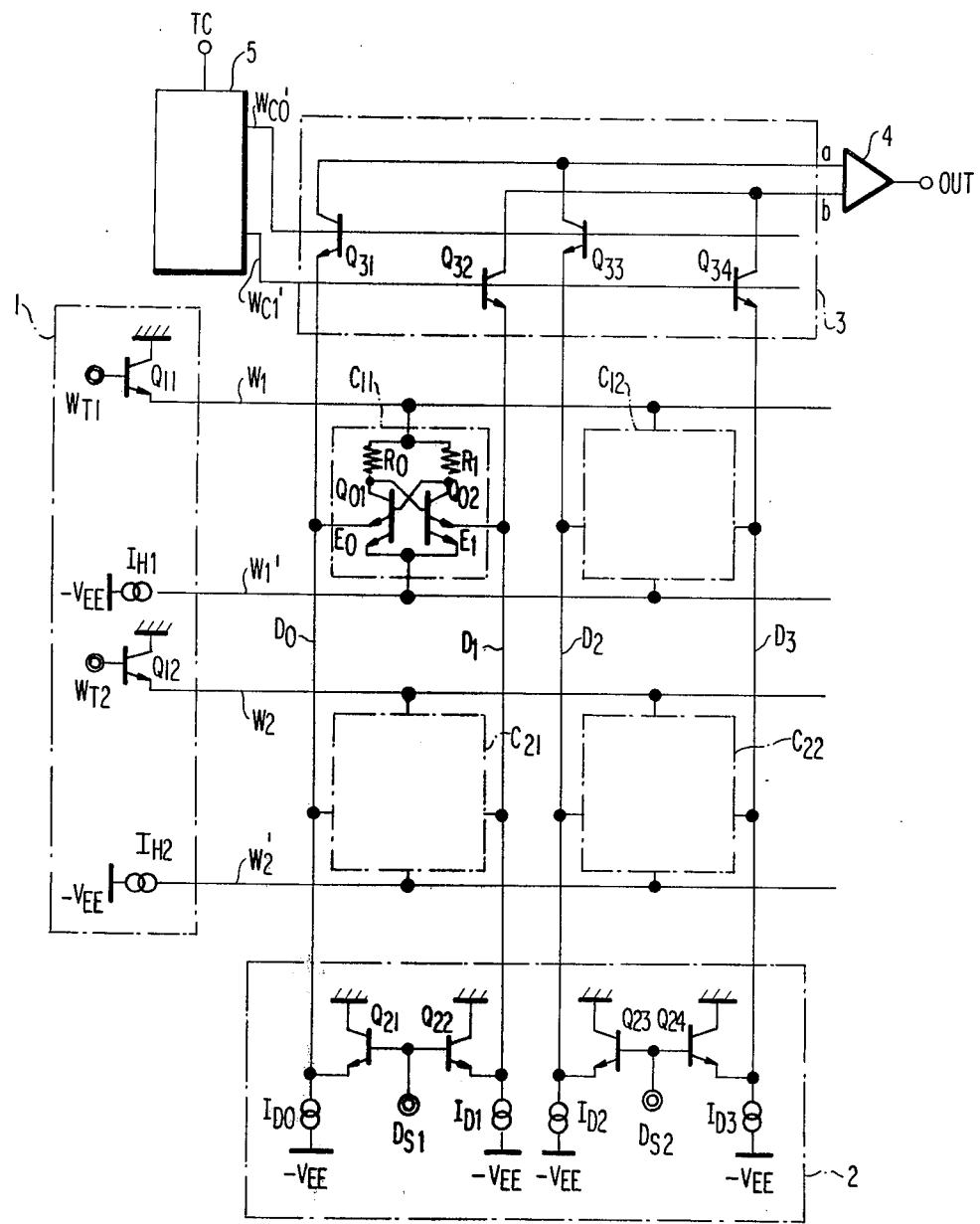
FIG. 2 shows a block diagram of an embodiment of a memory circuit according to the invention.

An embodiment of a semiconductor memory device according to the invention will be described with reference to FIG. 2 and FIGS. 3(a) and 3(b). As shown, the semiconductor memory device of the invention uses a pseudo-write control circuits 5 which produces write signal $W'_{c0}$ and $W'_{c1}$ in accordance with the level of a signal applied to a control terminal TC. The write signal $W'_{c0}$ and $W'_{c1}$ is applied to the base of the transistor $Q_{31}$ and $Q_{32}$. More specifically, when the signal appearing at the terminal $T_c$ is logical "1" (high level), the control circuit 5 produces the signals $W'_{c0}$ and $W'_{c1}$ with levels for pseudo-write mode which is described later. When the signal at the terminal $T_c$ is logical "0" (low level), the control circuit 5 produces the signals $W'_{c0}$ and $W'_{c1}$ with the level for the normal write mode such as in FIG. 1.

The normal write mode will be described with reference to FIG. 3(a). In the normal write mode, the signal at the terminal $T_c$ is logical "0". During the read period $T_{R1}$, the control signals $W'_{c0}$ and $W'_{c1}$ are at the medium level. At this time, the transistor $Q_{02}$ is non-conductive and the potential $C_{02}$ at the collector thereof is high in level, while the transistor $Q_{01}$ is conductive with the collector having a low level potential $C_{01}$. Then, during the write period $T_{w1}$, the control signal $W'_{c0}$ is high in level and the signal $W'_{c1}$ is low. Accordingly, the base potential ($W'_{c0}$) of the transistor $Q_{31}$ is high thereby to turn on the transistor $Q_{31}$ and to turn off the transistor $Q_{01}$. At the same time, the transistor $Q_{32}$ is turned off because the signal $W'_{c1}$ is low while the transistor $Q_{02}$ is turned on. As a result, the state of the memory cell $C_{11}$ is reversed and the reversed state is sustained during the succeeding read period $T_{R2}$.

The pseudo-write mode essential to the invention will be described with reference to FIG. 3(B). Assume that the transistor $Q_{01}$ is ON while the transistor $Q_{02}$ is OFF in the selected memory cell. During the succeeding pseudo-write period $T'_W$, the control signal $W'_{c0}$ is high in level. Accordingly, the base potential of the transistor $Q_{31}$ is higher than the collector potential $C_{02}$ of the transistor $Q_{02}$. In this case, the transistor $Q_{02}$ has the abnormally large base-emitter voltage $V_{BE}$. Such a large $V_{BE}$ reduces a potential difference between $C_{01}$ and $C_{02}$, i.e. holding voltage. As a result, the transistor $Q_{31}$ is ON while the transistor $Q_{01}$ is going to be OFF. At this time, if the level of the control signal $W'_{c1}$ is so determined that data is written not into a memory cell having a normal holding voltage but into a memory cell having a very small holding voltage, i.e., if the potential of the control signal $W'_{c1}$ is selected to be approximately equal to the abnormal holding voltage of the defective memory cell, the transistor $Q_{02}$ is conductive to allow inverse writing into the memory cell when the memory cell has holding voltage smaller than the abnormal holding potential, as indicated by the collector potential $C'_{01}$.

On the other hand, when the memory cell has the normal holding voltage, the transistor $Q_{02}$ is kept non-conductive, and the condition of the memory cell is not inverted, as indicated by the normal collector potential $C_{01}$.

Figure 3:
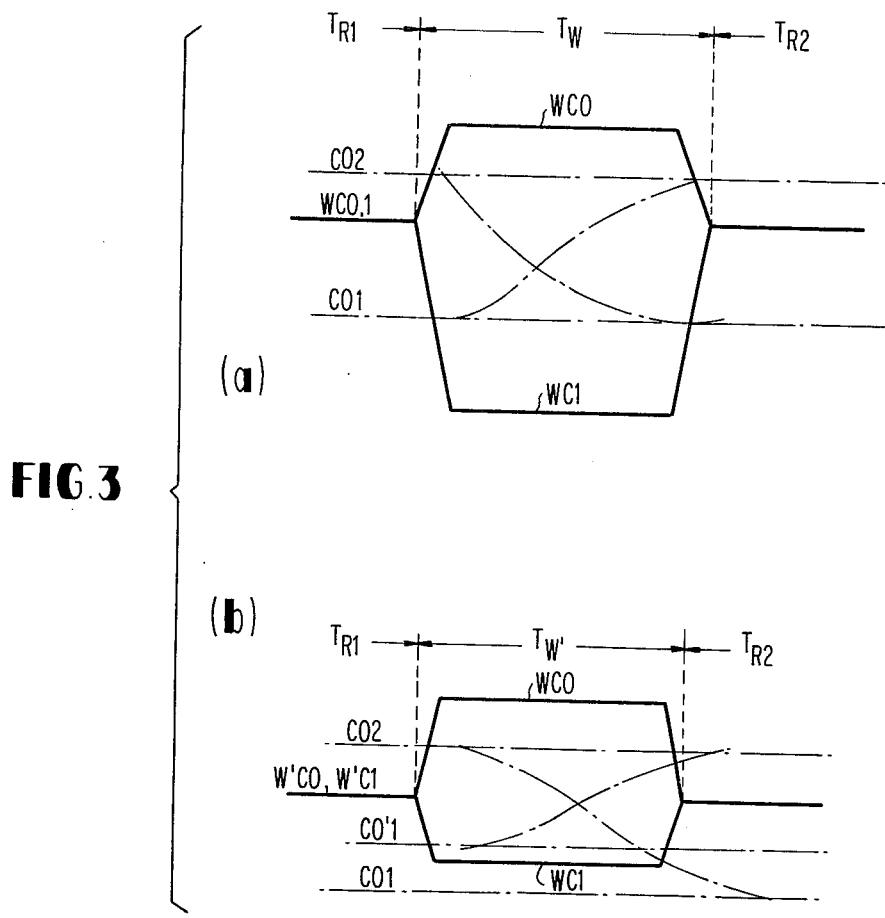
FIG. 3 shows wave forms for illustrating the operation of the memory circuit shown in FIG. 2, in which FIG. 3(a) a wave form for illustrating normal read and write operations

As described above, in the test of the memory device, the levels of the signals $W'_{c1}$ and $W'_{c0}$ are switchable between the normal levels (FIG. 3(a)) and the above mentioned test levels in accordance with the external signal from the terminal TC. In the normal levels, the same logic "1" or "0" is loaded into all of the memory cells of the memory device. Then, the levels $W'_{c1}$ and $W'_{c2}$ are switched to the test level and the content which is an inverse of that loaded by the normal level is loaded into the memory cells in the pseudo-write mode (FIG. 3(b)). Then, all the contents of the memory cells are read out by the normal levels of the signals $W'_{c1}$ and $W'_{c0}$. In this case, the contents of the memory cells which have been loaded by the normal levels, read out from the memory device having the memory cells with the normal holding voltage are not inverted. In the memory device including defective memory cells with the abnormal holding voltage, the contents read out from the detective memory cells are inverted. Depending on the result of the test, a memory device having defective memory cells can be detected and thereby removed.

In order to more effectively conduct the memory device test, the level of the signal $W'_{c0}$ ($W'_{c1}$) which is high at the time of the test must be set to be higher than the high level (at the time of the selection) of the signal at the terminal $W_{T1}$ ($W_{T2}$) so that the current $I_D$ is not shunted into the transistor being conductive of the memory cell. When the current $I_D$ is shunted into the cell, a large holding voltage appears across the collector resistor of the conductive transistor. The holding voltage hinders the pseudo-write into the defective cells.

Figure 4:
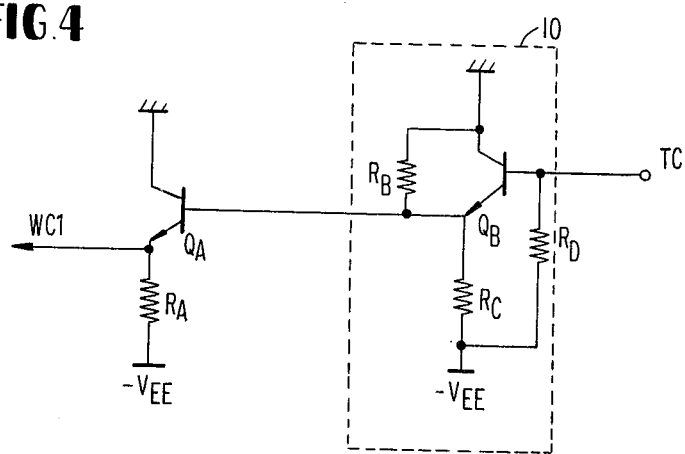
FIG. 4 shows a circuit diagram of an embodiment of the circuit for providing control signals $W'_{c1}$ and $W'_{c0}$.

Turning now to FIG. 4, there is shown an embodiment of a circuit to produce the control signals $W'_{c1}$ and $W'_{c0}$ in the pseudo-write mode. As shown, a transistor $Q_A$ and the emitter resistor $R_A$ are inserted between ground and a power source $V_{BE}$ to form an emitter follower circuit. A level generator 10 is provided to supply selectively a signal of two-value to the base of the transistor $Q_A$. In the level generator 10, resistor $R_B$ and $R_C$ serially connected between ground and the power source $-V_{BE}$, and the resistor $R_B$ is connected in parallel with the transistor $Q_B$. The base of the transistor $Q_B$ is biased by the resistor $R_D$ and is connected to an output terminal TC. In this circuit, the transistor $Q_A$ is controlled by the emitter potential of the transistor $Q_B$ which changes depending on the conduction and the non-conduction of the transistor $Q_B$. In the normal write mode, for example, the control terminal TC is opened or placed at $-V_{BE}$ or "0" level to turn on the transistor $Q_B$. The voltage determined by the resistance ratio between the resistors $R_B$ and $R_C$ at this time is applied to the base of the transistor $Q_A$. The conductivity of the transistor $Q_A$ at this time is small, so that the level of the signal $W'_{c1}$ is approximately $-V_{BE}$. In the pseudo-write mode, the transistor $Q_B$ is turned on by grounding the terminal TC. As a result, the base potential of the transistor $Q_A$ rises and the resistance of the transistor $Q_A$ becomes small. Therefore, the level of the signal $W'_{c1}$ is smaller than $-V_{BE}$ determined by the resistor $R_A$.

In this way, the level of the control signal $W'_{c1}$ is controlled. This is correspondingly applied to the control signal $W_{c0}$. Evidently, the control signal generating means for generating the control signals $W'_{c1}$ and $W'_{c0}$ is not limited to the circuit 10 shown in FIG. 4. For the test level control, an additional test pad may be provided at the terminal TC or a third value level may additionally be produced at a terminal not used at the pseudo-write mode, or at a chip selection of the terminal with a fixed level signal, an output terminal or the like.

Therefore, the defective memory cells having the abnormal holding voltage can be effectively detected even when the memory device is at the manufacturing state of wafer or is loaded into the package.

Figure 5:
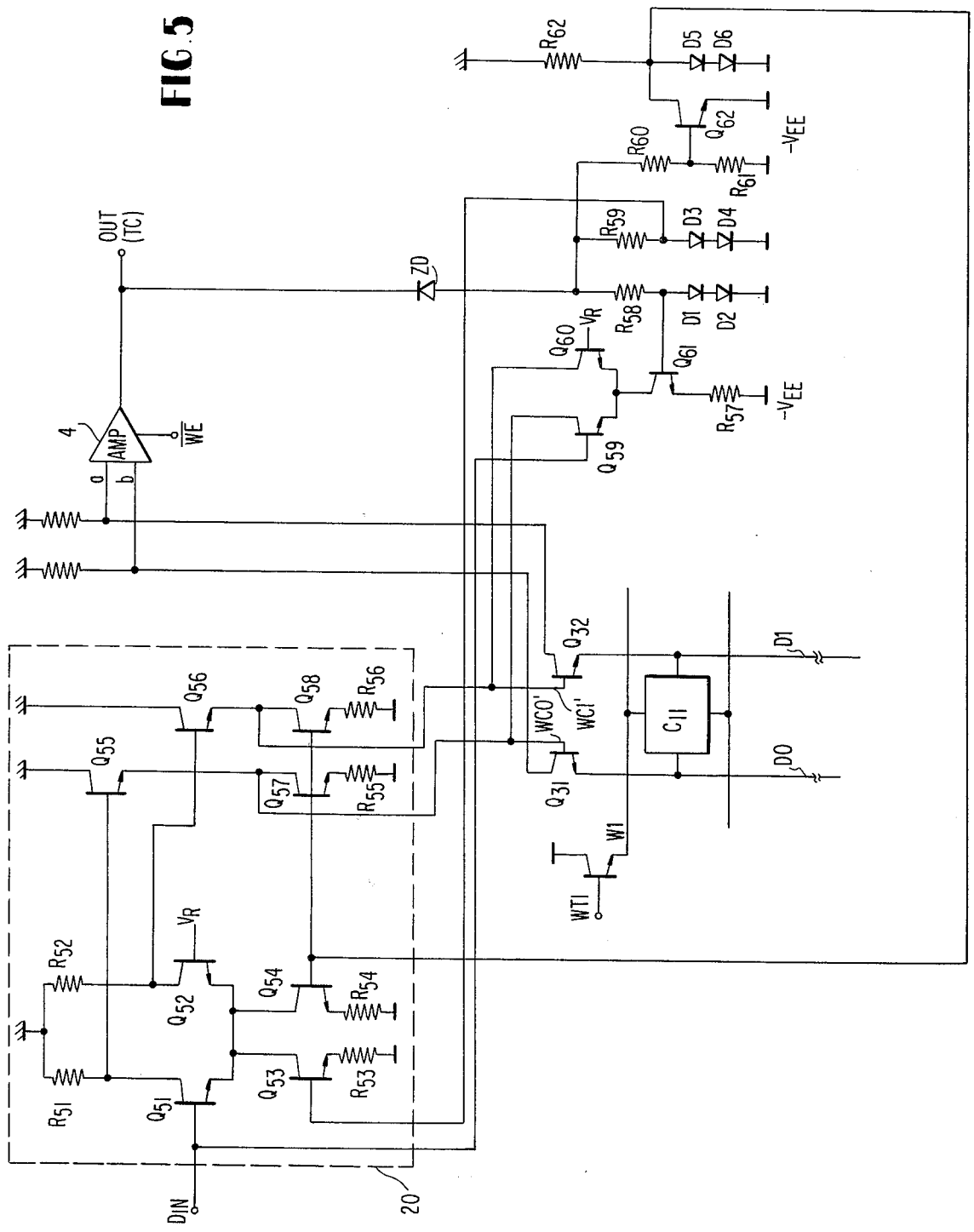
FIG. 5 shows a circuit diagram of another embodiment of the memory device according to the invention.

With reference to FIG. 5, another embodiment of the semiconductor memory device according to the invention will be described. In this embodiment, the read output terminal OUT is used also as the control terminal $T_c$. A voltage higher than the breakdown voltage of a Zener diode ZD applied to the output terminal OUT turns on a transistor $Q_{61}$ as a current source, so that a current switch circuit including transistors $Q_{59}$ and $Q_{60}$ is in an operating condition. The collectors of the transistors $Q_{59}$ and $Q_{60}$ are respectively coupled with emitters of the transistors $Q_{55}$ and $Q_{56}$ as the output portion of a data input circuit 20. From the emitters of the transistors $Q_{55}$ and $Q_{56}$ are derived the control signals $W'_{c0}$ and $W'_{c1}$. Three combinations of a transistor $Q_{54}$ and a resistor $R_{54}$, a transistor $Q_{57}$ and a resistor $R_{55}$, and a transistor $Q_{58}$ and a resistor $R_{56}$ respectively operate as constant current sources. Bases of the transistors $Q_{54}$, $Q_{57}$ and $Q_{58}$ are supplied with a constant voltage derived from a series circuit of a resistor $R_{62}$ and diodes $D_5$ and $D_6$. A transistor $Q_{62}$ and resistors $R_{60}$ and $R_{61}$ form a clamp circuit for clamping the above constant voltage. In the pseudo write mode, the above three constant current sources are disenabled by clamping the constant voltage at a low level because the transistor $Q_{62}$ is made conductive in response to a high level of the cathode of the diode ZD. While a constant current source composed of a transistor $Q_{53}$ and a resistor $R_{53}$ is enabled in response to a level at a junction between a resistor $R_{59}$ and a diode $D_3$. Herein, the constant current value of the constant current source composed of the transistor $Q_{53}$ and the resistor $R_{53}$ is set smaller than that of the current source composed of the transistor $Q_{54}$ and the resistor $R_{54}$. The amount of the constant current of the constant current source including the transistor $Q_{53}$ and the resistor $R_{53}$ can be controlled over some range in response to a controlability of the contant voltage from the junction between the resistor $R_{59}$ and the diode $D_3$ by the terminal OUT. With the above construction, when the level at the output terminal OUT is within the breakdown voltage of the Zener diode ZD, that is to say, in the normal write mode, the transistors $Q_{53}$, $Q_{61}$ and $Q_{62}$ are OFF state and hence an input signal supplied at an input terminal $D_{in}$ is transferred to the bases of the transistors $Q_{31}$ and $Q_{32}$ as signals $W'_{c0}$ and $W'_{c1}$ with the normal level such as shown in FIG. 3(a) through a current switching circuit including the transistors $Q_{51}$, $Q_{52}$ and $Q_{54}$ and emitter-follower transistors $Q_{55}$ and $Q_{56}$. While in the pseudo-write mode, a voltage higher than the breakdown voltage of the Zener diode ZD is applied to the terminal OUT to turn on the transistor $Q_{62}$ to clamp the constant voltage defined by the diodes $D_5$ and $D_6$ at the low level and hence the transistors $Q_{54}$, $Q_{57}$ and $Q_{58}$ are made OFF state. At the same time, the transistor $Q_{61}$ is also made conducting to enable the transistors $Q_{59}$ and $Q_{60}$. Thus, test levels supplied at the signal $W'_{c0}$ and $W'_{c1}$ are established by shifting the emitter voltages of the transistors $Q_{55}$ and $Q_{56}$ by the transistors $Q_{59}$ to $Q_{61}$ and by shifting the collector voltages of the transistors $Q_{51}$ and $Q_{52}$ by the transistor $Q_{53}$.

Figure 6:
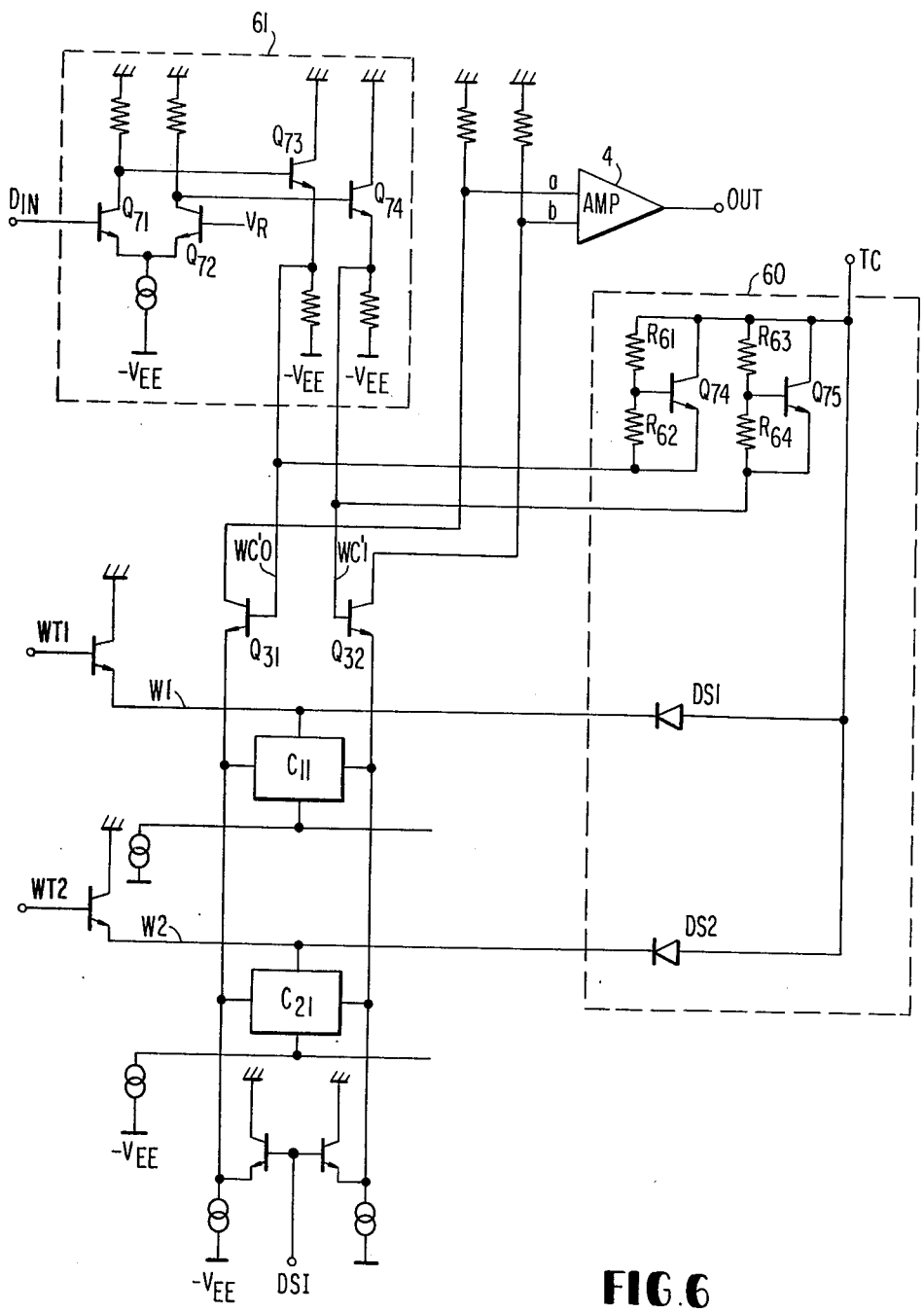
FIG. 6 shows a circuit diagram of still another embodiment of the memory device according to the invention.

With reference to FIG. 6, another embodiment of this invention will be described. A data input circuit 61 includes a current logic circuit having transistors $Q_{71}$ and $Q_{72}$ and emitter-follower transistors $Q_{73}$ and $Q_{74}$, from emitters of which the write control signals $W'_{c0}$ and $W'_{c1}$ are derived. Between the emitters of the transistors $Q_{73}$ and $Q_{74}$ and a control terminal Tc, a level shift circuit including a transistor $Q_{75}$ and resistors $R_{61}$ and $R_{62}$ and a level shift circuit including a transistor $Q_{75}$ and resistors $R_{03}$ and $R_{64}$ are respectively disposed. Diodes $DS_1$ and $DS_2$ are disposed between word lines $W_1$ and $W_2$ and the terminal TC. In this embodiment, a high level supplied at the terminal TC makes the memory device the pseudo-write mode wherein all the word lines are made a selection level by the diodes $DS_1$ and $DS_2$ and the levels $W'_{c0}$ and $W'_{c1}$, especially low one thereof are shifted by the circuit 60 as shown in FIG. 3(b). In this embodiment, all the memory cells are subjected to the test mode at the same time.

I claim:

1. A memory device comprising a plurality of memory cells, selection means for selecting one of said memory cells, first write control means which operates in a normal write mode, and second write control means which operates in a pseudo write mode to supply a signal lower than a threshold value at which the content of the normal memory cell is changed, to the memory cell to be tested.

2. The device according to claim 1, further comprising means for detecting whether the content of the memory cell subjected to said pseudo write mode is changed or not.

3. The device according to claim 2 further comprising a mode select terminal for receiving a signal selecting one of said normal write mode and said pseudo write mode.

4. A memory device comprising a plurality of memory cells, selection means for selecting one of said memory cells, first write means for supplying a write signal of a normal logic level to selected one of said memory cells, and second write means for supplying a pseudo write signal of a logic level lower than said normal logic level to at least said selected one of said memory cells.

5. The device according to claim 1 or 4, wherein each of said memory cells including a first and a second multi-emitter transistors, having cross-coupled bases and collectors.

6. A memory device comprising a plurality of memory cells, selection means for selecting one of said memory cells, first write means for supplying a true and a complementary write signals of normal logic levels in normal write mode to selected one of said memory cells and second write means for supplying a true and a complementary pseudo write signals in pseudo write mode to at least said selected one of said memory cells, difference in potential between said true and complementary pseudo write signals being smaller than that between said true and complementary normal logic signals.

7. The device according to claim 6, further comprising read means for detecting whether the content of said memory cells supplied with said true and complementary pseudo write signals has been changed or not.

8. The device according to claim 6, further comprising a plurality pairs of true and complementary digit lines, a plurality of word lines intersecting with said pairs of true and complementary digit lines, and a plurality of current sources coupled to said digit lines.

9. The device according to claim 8 wherein each of said memory cells include a first and a second multi-emitter transistors having cross-coupled bases and collectors, each of first emitters of said first and second multi-emitter transistor being coupled to said true and complementary digit lines respectively.

10. The device according to claim 9, further comprising a plurality of third transistor having an emitter coupled to said true digit lines and a plurality of fourth transistor having an emitter coupled to said complementary digit lines, said third and fourth transistors forming current switch circuits respectively with said first and second multi-emitter transistors.

11. The device according to claim 10, wherein either of said true and complementary write signals, and said true and complementary pseudo write signals are supplied to bases of said third and fourth transistors.

12. The device according to claim 10, further comprising a control terminal for receiving a control signal for commanding one of said normal write mode and said pseudo write mode.

13. The device according to claim 12, wherein said first write means including a current switch circuit responsive to an input signal to produce a true and a complementary signals, a first emitter follower circuit having said true signal at its input and an output coupled to the base of said third transistor and a second emitter follower circuit having said complementary signal at its input and an output coupled to the base of said fourth transistor, and said second write means including a first voltage shift means coupled between the base of said third transistor and said control terminal and a second voltage shift means coupled between the base of said fourth transistor.

14. The circuit according to claim 13, further including a plurality of diodes coupled between said word lines and said control terminal.

15. The circuit according to claim 13, further comprising an output terminal and a differential amplifier having a pair of inputs coupled to the bases of said third and fourth transistors.

16. A memory device comprising a plurality of memory cells, a selection circuit for selecting said memory cells a first write control circuit which operates in a first mode to write data into a selected memory cell and a second write control/circuit which operates in a second mode to write nothing into at least one memory cell when it is normal but write data into the memory cell when it is abnormal.

17. A method for checking a memory device including a plurality of memory cells, comprising the steps of writing the same and one logic data into a memory cell to be checked by supplying a write signal having a normal logic level thereto, supplying a pseudo write signal of a logic level smaller than a threshold value at which the content of the normal memory cell is changed, to said memory cell to be checked, thereafter reading out the content of said memory cell to be checked, and detecting whether the content of said memory cell written by said writing step has been changed or not, thereby determining abnormal memory cell.

* * * * *